United States Patent [19]

Boudreau

[11] 4,258,967
[45] Mar. 31, 1981

[54] INTEGRAL PIVOT AND LOCK APPARATUS FOR SLIDE RACK MOUNTED BOXES

[75] Inventor: Ronald B. Boudreau, Shirley, Mass.

[73] Assignee: Digital Equipment Corporation, Maynard, Mass.

[21] Appl. No.: 90,725

[22] Filed: Nov. 2, 1979

[51] Int. Cl.³ .............................................. A47B 88/00
[52] U.S. Cl. .................................. 312/322; 312/273; 312/280; 312/323
[58] Field of Search .............. 312/322, 323, 320, 280, 312/273, 294

[56] References Cited

U.S. PATENT DOCUMENTS

| | | | |
|---|---|---|---|
| 321,078 | 6/1885 | Birckhead | 312/323 |
| 1,524,767 | 2/1925 | Vandervoort | 312/323 |
| 2,420,011 | 5/1947 | Paxton et al. | 312/294 |
| 2,566,186 | 8/1951 | Gillett | 312/323 |
| 2,648,583 | 8/1953 | Teach | 312/320 |
| 2,650,789 | 9/1953 | Stropnicky | 312/323 |
| 2,655,422 | 10/1953 | Gussack | 312/323 |
| 2,809,085 | 10/1957 | Fall | 312/323 |
| 2,856,450 | 10/1958 | Padgett et al. | 312/323 |
| 3,146,048 | 8/1964 | Graham et al. | 312/323 |
| 3,218,112 | 11/1965 | Stark | 312/320 |
| 3,220,364 | 11/1965 | Sandin | 312/320 |
| 3,239,298 | 3/1966 | McCarthy | 312/320 |
| 3,295,905 | 1/1967 | Sisk et al. | 312/273 |
| 3,728,662 | 4/1973 | Puri | 312/320 |
| 3,759,475 | 9/1973 | Brown | 312/273 |

Primary Examiner—Victor N. Sakran
Attorney, Agent, or Firm—Maureen Stretch

[57] ABSTRACT

An integral pivot and lock apparatus for slide rack mounted mounting boxes is disclosed. The apparatus comprises a positioning means, such as index plate (38), having a number of locking positions (46), (47), (48); the positioning means is fastened to the box (14) by a pivot means (40) and to the slide rack (16). The mounting box (14) contains a locking means such as locking arm (34) mounted on a slideable retractor plate (24). The apparatus enables the slide rack mounted box (14) to be pivoted and locked into a number of different positions when the box has been extended from the housing (10). Safety stop features are also included in the apparatus.

4 Claims, 5 Drawing Figures

INTEGRAL PIVOT AND LOCK APPARATUS FOR SLIDE RACK MOUNTED BOXES

FIELD OF THE INVENTION

This invention relates generally to mechanical apparatus and more particularly to pivot and lock mechanisms for mounting boxes mounted on slide racks in a housing.

BACKGROUND ART

In many electronic cabinet housings, mounting boxes containing electronic modules are mounted on one or more sliding racks or rails so that they can be extended away from the cabinet for servicing or access. It is desirable to be able to tilt the box through the vertical plane once it has been extended away from the cabinet, to provide better access to the box for servicing or replacement of parts.

Typically, a positioning and locking mechanism included in the front portion of the slide rack will permit this tilting and locking of boxes. This positioning and locking mechanism is constructed by adding an artificial wall to the end of the slide rack and welding or otherwise securing to this wall a pawl and ratchet. The front portion of the slide rack containing the pawl and ratchet mechanism is then bolted or screwed to the box so that the box and the front portion of the slide rack are able to pivot with respect to slide rack and can also be locked into place.

This apparatus for pivoting and locking the box in place is very complicated to manufacture as part of the slide rack mechanism, especially when the boxes in the cabinet have significant weight, and when space between the boxes or the slide mechanism and the cabinet is small and at a premium. Because the primary purpose of the slide rack is to provide the horizontal sliding motion of the box, it is difficult to optimally locate the pivot point on the slide rack in the place most capable of bearing heavy weight loads. Because the space between boxes in the cabinet is at a premium, the thickness of the slide mechanism is constrained. Thus, the front portion must be made of relatively thin materials and parts, which limits the slide's weight capacity. With these space constraints, complex and expensive mechanisms are required to permit the parts to accomplish their tilting and locking functions without occupying too much space and without breaking or bending under heavier loads.

In the prior art, box removal required the use of detachable slide sections. The detachable section was costly and complicated to manufacture, for it required the addition of failsafe detent stop mechanisms. For example, without the failsafe stop, a box could be pulled from a cabinet at such a velocity as to cause a detent to fail. A detent failure would cause the box to become unsupported with the possibility of injury to the operator.

Consequently it is an object of this invention to provide an integral pivot and locking mechanism for slide rack mounted boxes, such mechanism also being capable of bearing heavier loads. It is another object of this invention to provide a tilting and locking mechanism for a mounting box which is simple to manufacture without any loss of load bearing capacity. Still another object of this invention is to provide a pivoting and locking mechanism for a mounting box which is significantly less expensive to produce and which can be used in conjunction with standard slide racks such as, for example, ball bearing or solid bearing telescoping rail slide systems. Yet another object of this invention is to provide safety features for the tilting and locking mechanism so that accidental pivoting of the mounting box past a pre-determined arc of motion cannot occur. Other objects and advantages of the invention will become apparent upon reading the following detailed description and upon reference to the drawings.

SUMMARY OF THE INVENTION

This invention comprises apparatus for pivoting and locking a mounting box which is mounted on a slide rack in a housing wherein the pivot and locking mechanisms are embedded in the side wall of the mounting box. This is accomplished by constructing a positioning means fixed to the outside wall of the box, and a retractable locking means fixed to the inside wall of the box, with a portion of the locking means extending through the wall of the box such that the lock mechanism can be retracted or engaged from outside the box. The box can thus pivot about the slide rack. As the lock mechanism engages the positioning means the module locks in position. Safety stops are also included in the positioning means. The mounting box, including the integral pivot and lock mechanism, may be attached to any of a number of various sliding rack mechanisms by means of a pivot screw or other pivot means.

BEST MODE FOR CARRYING OUT THE INVENTION

Figure 1:
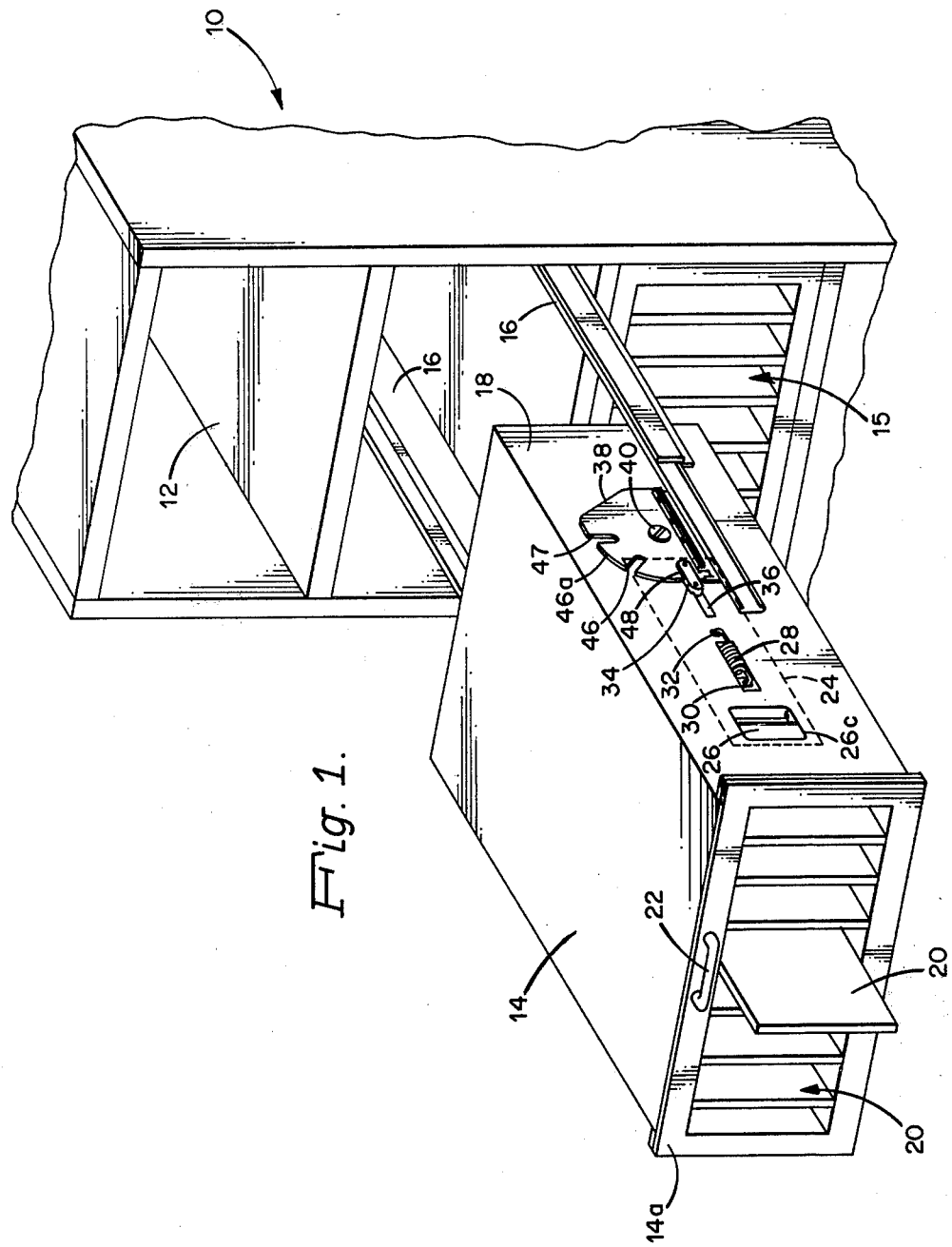
FIG. 1 represents a perspective view of a mounting box extended from a housing by means of a slide rack, the box including the pivot and locking mechanism of the present invention.

Referring to FIG. 1, there is shown a typical cabinet housing 10, for enclosure of one or more mounting boxes such as boxes 14 and 15. A frame 12 within the cabinet housing is used to secure the slides to the housing 10. In particular, each box, such as box 14, is secured to one or more slide racks 16 such that the box 14 can be slidably inserted into the housing 10 on slide rack 16. This horizontal movement can be accomplished by a number of standard mechanisms such as pull handle 22 shown on the front of module 14.

A typical use for such a housing and mounting box assembly is the storage of electronic equipment such as a plurality of electronic module component boards 20. Other purposes can be served by the use of this housing system. Typically, it is desirable to be able to tilt the box once it has been extended away from the housing 10, to more easily obtain access to the contents of box 14.

Figure 2:
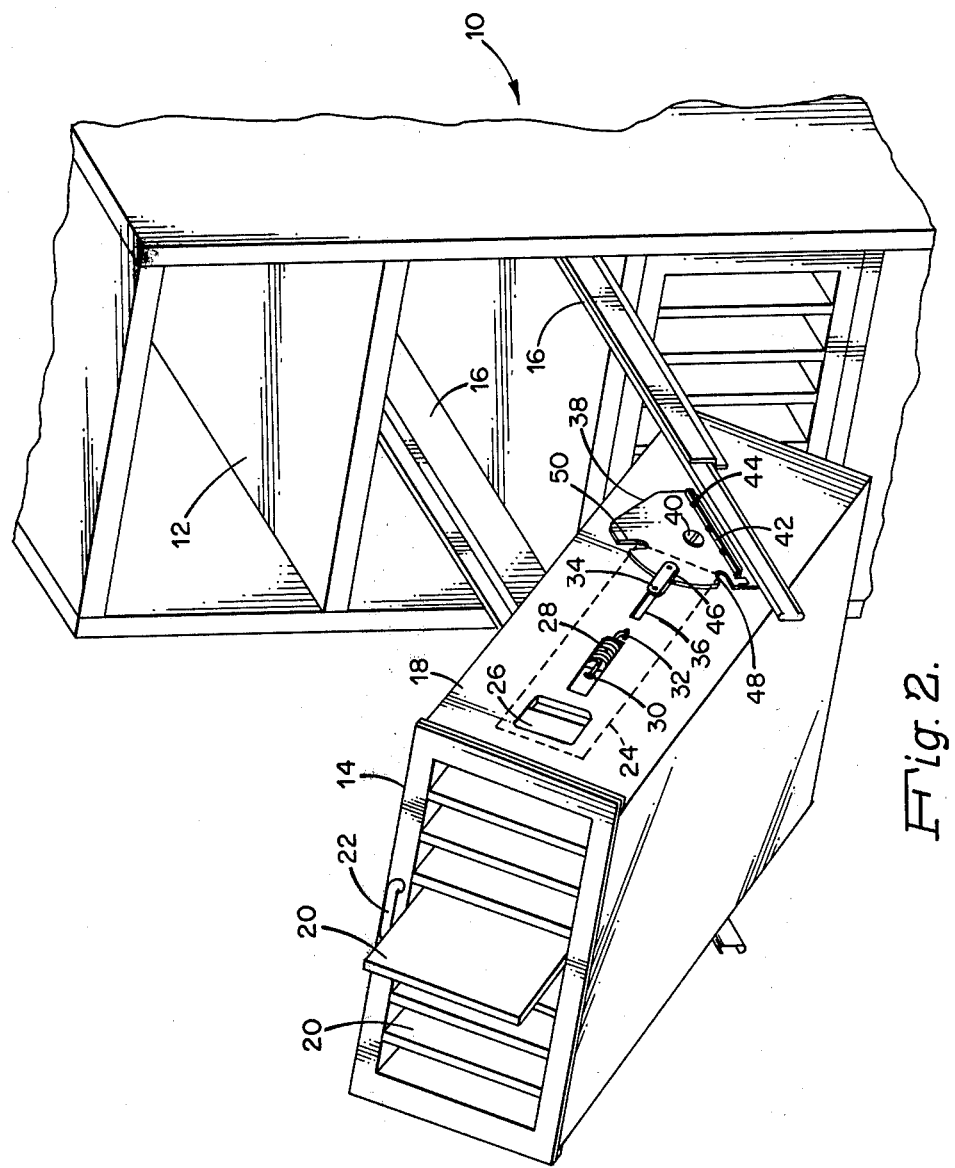
FIG. 2 is a perspective view of the integral pivot and locking mechanism wherein the mounting box has been pivoted and locked to a second position with respect to the housing and slide.

Tilting to a 45° angle or another angle makes it easier for service or maintenance personnel to work with the electronic component contents 20 of the box, as shown in FIG. 2.

Returning to FIG. 1, on the side wall 18 of box 14 a retractor plate 24 (shown in dotted lines) is mounted flush with the inside portion of wall 18. Retractor plate 24 contains the components of the locking means which holds the box in one of several positions. In the illustration in FIG. 1 a hand grip means 26 is a recessed portion of retractor plate 24 accessible through aperture 26c of box wall 18. When hand grip 26 is pulled, retractor plate 24 moves in a horizontal plane towards the front of box 14. The return movement of retractor plate 24 is controlled by a spring means 28, which is attached at one connecting end 30 to the retractor plate 24 and at its other connecting end 32 to the outside wall 18 of box 14. When hand grip 26 is released the spring means 28 contracts, pulling the retractor plate 24 in a rearwards motion away from the front of the box.

A locking arm 34, fastened to the retractor plate 24 by means of mounting screws, is disposed thereon such that it protrudes through aperture 36 in the box wall 18. As the hand grip 26 is engaged and released, locking arm 34 slides back and forth within aperture 36.

As depicted in FIG. 1, locking arm 34 engages a notch 48 in a index plate 38 to cooperate therewith to lock box 14. The index plate 38 has an arc shaped edge 46a having a plurality of notches 46, 47, 48 shaped for capturing locking arm 34. The index plate 38 is affixed to box 14 by means of a pivot screw 40 which extends from the outside of plate 38 through the inside of wall 18.

Referring now to FIG. 2, index plate 38 is also attached to slide rack 16 by means of a protruding edge 42 which serves as a connecting edge to slide rack 16 such that screws 44, or bolts or another fastening means can hold index plate 38 in the stationary position at the forward end of slide rack 16. This construction of index plate 38 permits it to be attached directly to the slide rack 16 or to an adaptor plate fitted on slide rack 16. It also permits simple detachment from the slide rack so that box 14 may be easily removed from the slide rack 16.

Although index plate 38 is shown in the preferred embodiment with three notches, 46, 47 and 48, it is obvious from the illustration that it could be made with a varying number of notches or other means for capturing and holding a locking mechanism such as that shown at 34. Similarly, where index plate 38 is shown in the preferred embodiment primarily attached to box 14, index plate 38 could be manufactured with the slide rack 16 without deviating from the object of the invention.

Retractor plate 24 with its associated hand grip 26 spring means 28, and locking arm 34, can be constructed in a number of different fashions than in the preferred embodiment shown here. For example, retractor plate 24 could control the motion of a brake shoe in conjunction with a brake drum. And while retractor plate 24 is shown assembled into a rectangular box, the mechanism could be incorporated in any shape of chassis or container having at least one side portion capable of receiving retractor plate 24. In the preferred embodiment of this invention, the locking means is integrated with wall 18 of the box such that the thickest portions of the locking mechanism are embedded within box 14's interior side wall 18. In the preferred embodiment index plate 38 is also initially assembled as part of box 14. Thus it can be seen from FIG. 2 that box 14 with its respective retractor plate 24 and index plate 38 may be assembled separately from slide rack 16 and subsequently mounted by means of connecting edge 42 to any sliding rack or telescoping slide mechanism suitable for the mounting box.

In the preferred embodiment an integral pivot and lock mechanism is assembled in both side walls of box 14 such that the box can be locked on two supporting slide racks. This gives additional stability for very heavy weight loads.

Figure 2A:
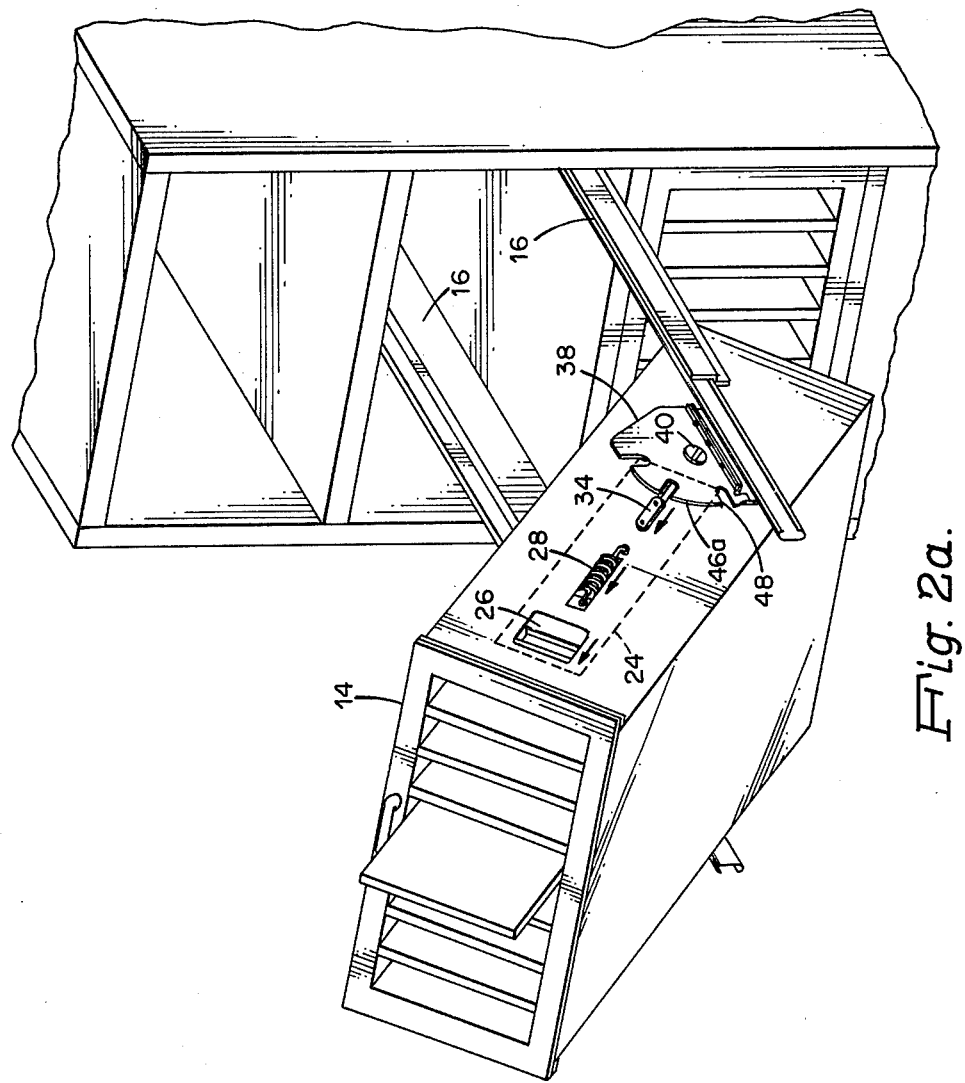
FIG. 2a is a perspective view of the integral pivot and lock mechanism depicting the lock mechanism disengaged so the box can be rotated to another position.

Referring now to FIG. 2a, the function of the integral pivot and lock mechanism is more clearly shown. In FIG. 2a mounting box 14 has been pivoted to a 45° angle position. This has been accomplished by applying pressure on hand grip 26 to pull retractor plate 24 forward, such that locking arm 34 becomes disengaged from notch 48 and is free to travel above surface 46a of index plate 38. As can be seen in FIG. 2a, locking arm 34 is about to be released into another notch to hold the module in a locked position at a 45° angle with respect to slide rack 16. This is accomplished by pivoting box 14 about pivot screw 40 once the locking arm 34 has been disengaged from notch 48. It can also be seen that index plate 38 remains in a stationary position with respect to slide rack 16, although the box 14 has moved to the 45° angle.

FIG. 2 shows the mounting box after it has been pivoted and locked in a new position from that which was shown in FIG. 1. Specifically, box 14 having been rotated about pivot screw 40 to the 45° angle with respect to slide rack 16, is locked into place by releasing retractor plate 24 such that locking arm 34 engages notch 46 on index plate 38 via spring means 28. Spring means 28 is arranged such that when pressure on hand grip 26 is released, spring means 28 will contract, pulling the retractor plate and locking arm 34 rearwardly to engage with index plate 38 so that the box is held in a firm, locked position.

Figure 3:
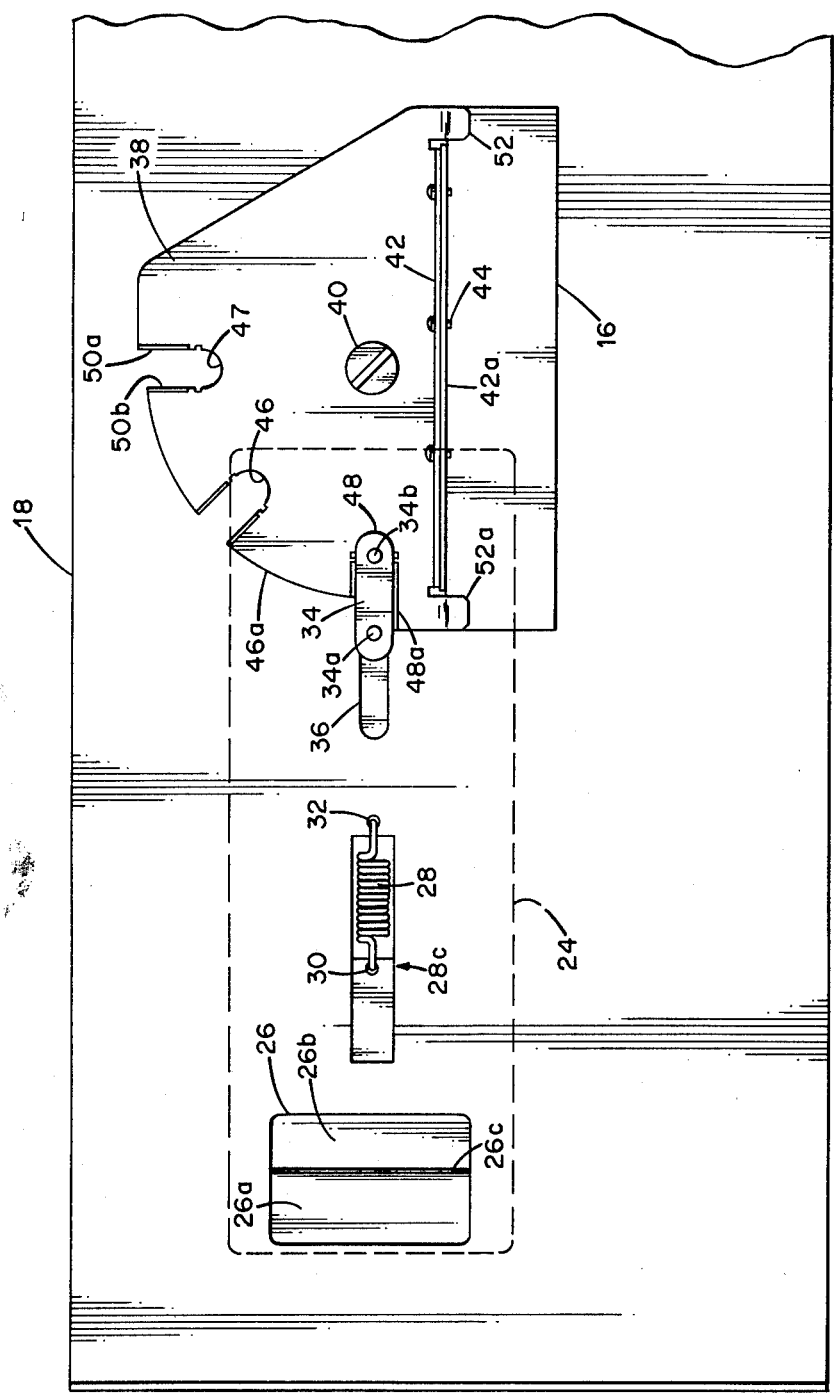
FIG. 3 is a side view of the integral pivot and lock mechanism taken from the outside wall of the mounting box.

As shown in FIG. 3, it is a further feature of this invention that index plate 38 contains at least one safety stop or pivotal limit, comprising a notched edge 50a, which extends outward beyond the normal edge of the arc, such that when locking arm 34 is moving above the arc shaped edge 46a it is unable to move past outwardly extending member 50a, or beyond the 90° angle in this particular instance. This serves as a safety feature. Additionally, another safety stop 48a has been provided on the lower portion of notch 48 to prevent movement downwards below the horizontal. The safety stops can be placed at any desired notches or locations.

As can be seen in FIG. 2, movement of mounting box 14 with respect to slide rack 16 is limited to a 90° arc between the 0 degree or horizontal position as shown in FIG. 1, and a 90° upright position which would be obtained if box 14 were moved to notch 47. Index plate 38 could also be built with a lower protruding portion to permit downward movement through another 90° arc. In other applications or uses of this invention a more circular index plate could also be constructed to permit movement in a 360° arc around slide rack 16. Similarly, pivoting of the box 14 through the horizontal plane rather than the vertical could be provided.

It is a feature of the invention that incorporating the retractor plate 24 and locking arm 34 inside of mounting box 14 and incorporating index plate 38 in the side of the box permits best space utilization to be made of interior wall space inside box 14, and minimizes the space needed on slide rack 16 to support such a pivot and lock mechanism. In typical electronics mounting box assemblies interior wall space inside the box is available, while space between boxes and cabinet structures is at a premium. This invention permits the use of standard and diverse slide assemblies which occupy the smallest space.

Turning now to FIG. 3, more specific details of the preferred embodiment are shown. The retractor plate 24 (shown by dotted lines) is mounted inside the mounting box 14. Retractor plate 24 has a recessed portion 26b as well as an outwardly extending portion 26a which form the hand grip means 26. This structure is accessed through an aperture 26c stamped in the side of box wall 18. Similarly, a stamped aperture 28c permits spring mechanism 28 to connect inward at connector end 30 to retractor plate 24 and at its other end 32, spring means 28 is connected to the outside wall 18 of the module. Aperture 36 permits locking arm 34 to protrude through wall 18. Locking arm 34 is bolted or screwed via screw means 34a and 34b to retractor plate 24. As can be seen, aperture 36 extends a short distance beyond locking arm 34 thus the additional clearance in aperture 36 permits locking arm 34 to move in and out of the notched edge 46a of index plate 38.

Depending on the weight of material to be carried by or mounted on box 14, retractor plate 24 can be constructed of any appropriately durable material capable of receiving a locking device. In the preferred embodiment a metal plate has been used to support weights of up to 200 pounds or 91 kilograms.

In FIG. 3, the connecting edge 42 on index plate 38 can be more clearly seen as an outwardly extending edge which hangs over slide rack 16 and can be affixed to the upper portion of slide rack 16 by screws or bolts such as that shown at 44 or by any other permanent attaching means. For added stability, in the preferred embodiment, index plate 38 is formed with downwardly extending tabs 52 and 52a which grip the outside of slide rack 16 and provide captive action to hold index plate 38 firmly in place on slide rack 16 while installing mounting screws.

Index plate 38, as can be seen in FIG. 3, is also attached to wall 18 of the mounting box by pivot screw 40 which holds index plate 38 flush against the side wall 18 of the box, but permits the box to pivot about pivot screw 40 in index plate 38. Pivot screw 40 is of shoulder screw design. Any pivoting means which would accomplish a similar function could be used.

Still another feature of this invention is that connecting index plate 38 to wall 18 by the pivot screw 40 permits more flexibility in mounting box 14 on the slide rack to achieve a better weight and load balance by moving the center of gravity forward or backward on slide rack 16.

The safety stop feature shown in FIGS. 1 and 2 can be more clearly seen in FIG. 3 at points 50a and 50b. Outwardly extending edge 50a is higher on index plate 38 than opposing edge 50b. This outward extension serves to stop the movement of locking arm 34 when the locking means is pivoted towards the 90° angle. Index plate 38 can be formed with one or more such safety stop mechanisms as that shown at 50a. In the preferred embodiment, a safety stop is also provided at the lower edge at 48a.

Figure 4:
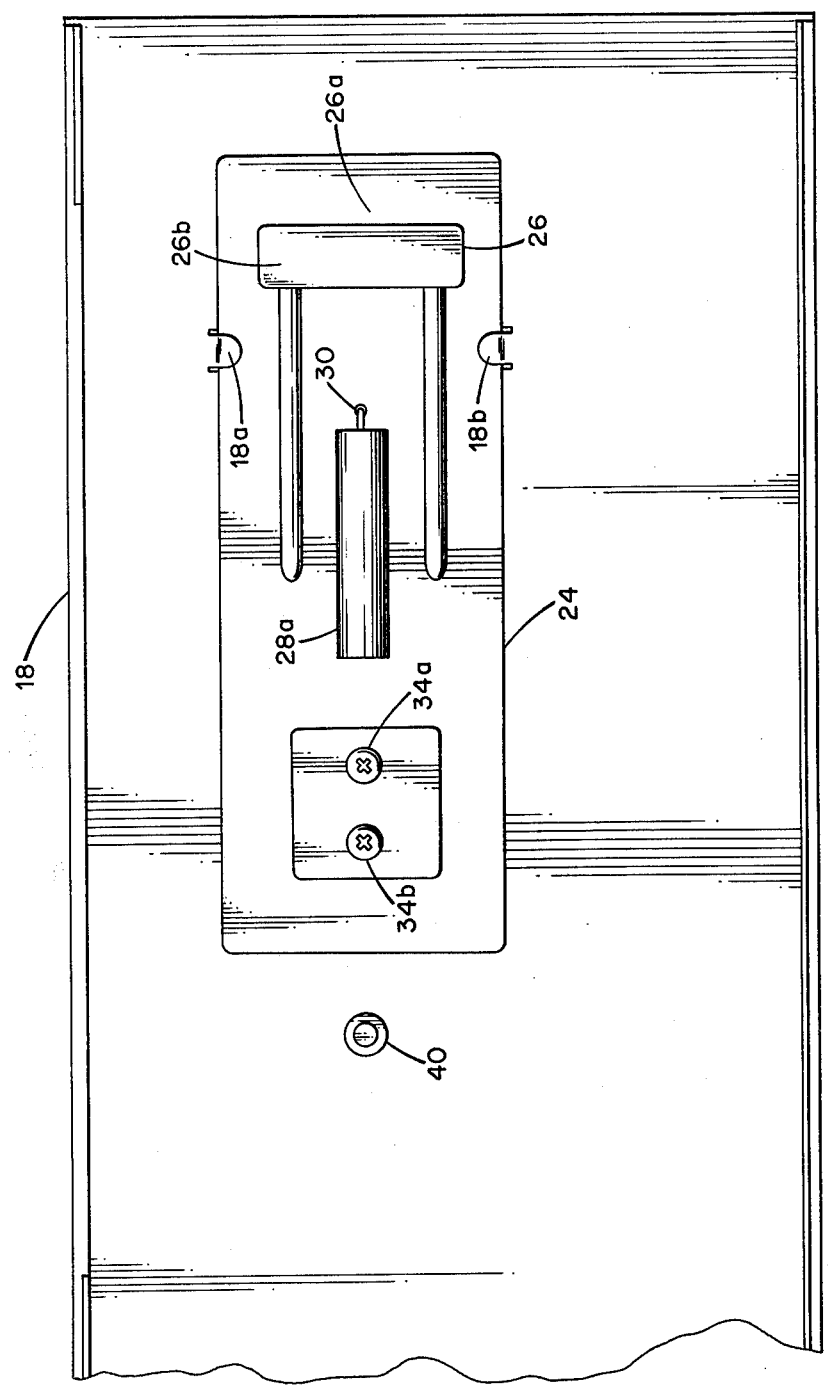
FIG. 4 is a side view of the inner wall of the mounting box with the interior portion of the integral pivot and locking mechanism shown.

Referring now to FIG. 4, a detailed view of the inside of mounting box 14 is shown, this view giving a picture of the inside of wall 18. Retractor plate 24 is slidably mounted inside wall 18 and held in a horizontal place with respect to wall 18 by means of tabs 18a and 18b which extend downwardly and upwardly respectively to capture retractor plate 24 flush against the side wall of module 18. The rear portion of hand grip means 26 is also shown in FIG. 4, including curved portion 26b corresponding to the recessed finger well shown at 26b on FIG. 3, and the flattened portion at 26a corresponding to the upwardly extending portion shown in FIG. 3 at 26a. This hand grip means can be formed by stamping out the recesses in the manufacture of retractor plate 24.

Movement of retractor plate 24 is controlled by spring means 28 as shown in FIG. 3, and FIG. 4 shows spring well 28a formed as a recessed portion of retractor plate 24. Connector 30 which attaches spring means 28 to retractor plate 24 is shown from the inside view in FIG. 4 at 30. Locking arm 34 is held against retractor plate 24 by means of screws 34a and 34b which are also shown in the inside view of the locking mechanism. Finally, pivot screw 40 is shown in FIG. 4 at the inside wall 18 of module 14.

Thus, it can be appreciated that the present invention comprises an integral pivot and lock apparatus that fully satisfies the objects, aim, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications and variations as come within the spirit and broad scope of the appended claims.

What is claimed is:

1. In a housing having a frame for supporting at least one mounting box, the box being mounted on at least one slide rack attached to the frame such that the box can be slidably extended out of and into the housing, apparatus for pivoting and locking the extended box in any of a plurality of positions, comprising:
   a positioning means, having a plurality of locking positions and fastened to the slide rack;
   a pivoting means, secured to the positioning means, and attached to the mounting box such that the box may be rotated about the pivoting means when the slide rack is extended from the housing; and
   a locking means integrally located in the mounting box for slidably engaging the locking positions in the positioning means, such that the locking means may be disengaged from a first locking position for rotating the mounting box and re-engaged into another of the locking positions to lock the box in a second locking position, each locking position forming a different angle with respect to the plane of the slide rack.

2. The apparatus as recited in claim 1 wherein the locking means further comprises:
   a retractor plate for hand operating the locking means, the retractor plate having a side surface containing a hand grip means located in the forward portion of the surface for sliding the retractor plate, the retractor plate also having a locking arm attached to the rearward portion of the surface for engaging the locking positions of the positioning means, the locking arm disengaging a locking position when the retractor plate is moved forward;
   a spring means having a first connector attached to the forward portion of the surface of the retractor plate and a second connector attached to the module for moving the retractor plate rearward so that the locking arm engages another of the locking positions; and a mounting means for fastening the retractor plate within the mounting box such that the locking means can be accessed from outside the box and such that the locking arm protrudes from the box and the retractor plate in order to engage the positioning means.

3. The apparatus as recited in claim 2 wherein the positioning means further comprises:

an index plate having a plurality of indented notches along an arc shaped edge comprising the locking positions, the notches being shaped to capture the locking arm;

the index plate having a connecting edge extending away from the index plate for fastening the index plate to the slide rack; and the index plate having a pivot screw for attaching the index plate to the mounting box.

4. The apparatus as recited in claim 3 wherein at least one of the indented notches in the index plate has an outwardly protruding edge such that the locking arm cannot be pivoted over it, the outwardly protruding edge providing a safety stop mechanism.

* * * * *